(12) United States Patent
Arnold et al.

(10) Patent No.: US 10,242,872 B2
(45) Date of Patent: Mar. 26, 2019

(54) REWORK OF PATTERNED DIELECTRIC AND METAL HARDMASK FILMS

(71) Applicant: INTERNATIONAL BUSINESS MACHINES CORPORATION, Armonk, NY (US)

(72) Inventors: John C. Arnold, North Chatham, NY (US); Prasad Bhosale, Albany, NY (US); Donald F. Canaperi, Bridgewater, CT (US); Raghuveer R. Patlolla, Guilderland, NY (US); Cornelius B. Peethala, Albany, NY (US); Hosadurga Shobha, Niskayuna, NY (US); Theodorus E. Standaert, Clifton Park, NY (US)

(73) Assignee: International Business Machines Corporation, Armonk, NY (US)

(*) Notice: Subject to any disclaimer, the term of this patent is extended or adjusted under 35 U.S.C. 154(b) by 71 days.

(21) Appl. No.: 15/464,758

(22) Filed: Mar. 21, 2017

(65) Prior Publication Data

US 2018/0277369 A1 Sep. 27, 2018

(51) Int. Cl.
| | |
|---|---|
| *H01L 21/302* | (2006.01) |
| *H01L 21/033* | (2006.01) |
| *H01L 21/3105* | (2006.01) |
| *H01L 21/311* | (2006.01) |
| *H01L 21/66* | (2006.01) |
| *H01L 21/768* | (2006.01) |
| *H01L 21/3213* | (2006.01) |

(52) U.S. Cl.
CPC ...... *H01L 21/0337* (2013.01); *H01L 21/0335* (2013.01); *H01L 21/31053* (2013.01); *H01L 21/31111* (2013.01); *H01L 21/32134* (2013.01); *H01L 21/32135* (2013.01); *H01L 21/76808* (2013.01); *H01L 21/76832* (2013.01); *H01L 22/12* (2013.01)

(58) Field of Classification Search
CPC ............ H01L 21/0337; H01L 21/0335; H01L 21/3111; H01L 22/12; H01L 21/76808; H01L 21/76832; H01L 21/32134; H01L 21/32135

See application file for complete search history.

(56) References Cited

U.S. PATENT DOCUMENTS

| | | | |
|---|---|---|---|
| 6,071,809 A | * | 6/2000 | Zhao ............... H01L 21/7681 257/E21.579 |
| 6,399,446 B1 | | 6/2002 | Rangarajan et al. |
| 6,551,874 B2 | | 4/2003 | Pohl et al. |
| 6,674,168 B1 | | 1/2004 | Cooney, III et al. |

(Continued)

OTHER PUBLICATIONS

Tang, T.E. et al., Titanium Nitride Local Interconnect Technology for VLSI IEEE Transacations on Electron Devices (Mar. 1987) pp. 682-688, vol. ED-34, No. 3.

*Primary Examiner* — Savitr Mulpuri

(74) *Attorney, Agent, or Firm* — Tutunjian & Bitetto, P.C.; Vazken Alexanian

(57) ABSTRACT

A method for reworking a semiconductor device includes, in a pattern stack formed on an interlevel dielectric (ILD) layer, polishing the pattern stack to remove a top hardmask layer of the pattern stack. Each hardmask layer of the pattern stack is selectively wet etched to remaining layers of the pattern stack and the ILD layer. A reworked pattern stack is reformed on the ILD layer.

25 Claims, 5 Drawing Sheets

(56) References Cited

U.S. PATENT DOCUMENTS

| | | | |
|---|---|---|---|
| 6,767,833 B2 | 7/2004 | Shih et al. | |
| 6,821,865 B2 | 11/2004 | Wise et al. | |
| 7,008,803 B2 | 3/2006 | Kane et al. | |
| 8,222,143 B2 | 7/2012 | Liu et al. | |
| 8,987,133 B2 | 3/2015 | Nguyen et al. | |
| 9,190,285 B1* | 11/2015 | Abdallah | H01L 21/31144 |
| 2003/0219973 A1* | 11/2003 | Townsend, III | H01L 21/0271 |
| | | | 438/631 |
| 2004/0082176 A1 | 4/2004 | Kane et al. | |
| 2007/0148966 A1* | 6/2007 | Baks | H01L 21/31116 |
| | | | 438/638 |
| 2010/0190272 A1* | 7/2010 | Zhang | H01L 21/31144 |
| | | | 438/4 |
| 2015/0325450 A1* | 11/2015 | Abdallah | H01L 21/31144 |
| | | | 438/692 |

* cited by examiner

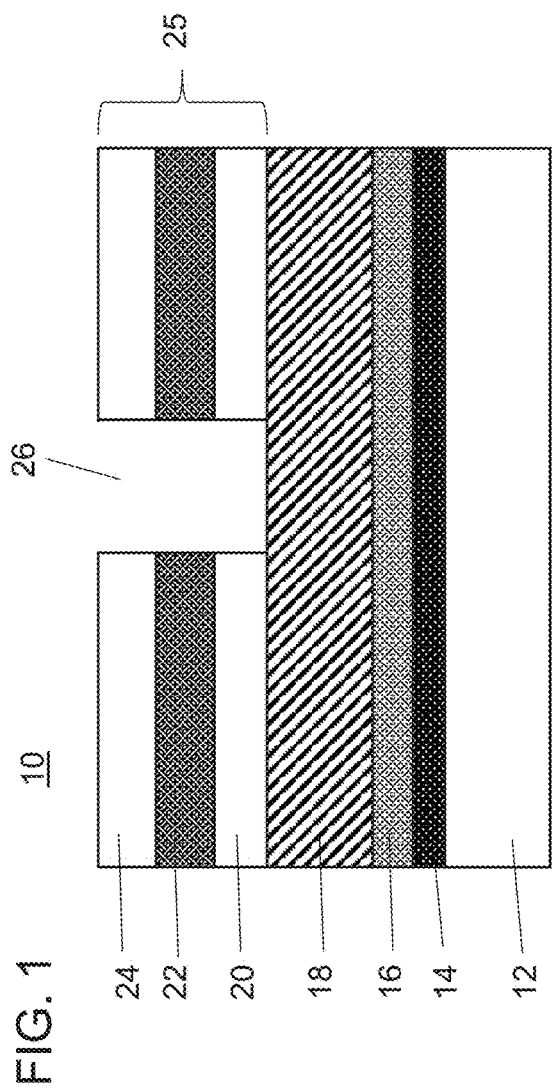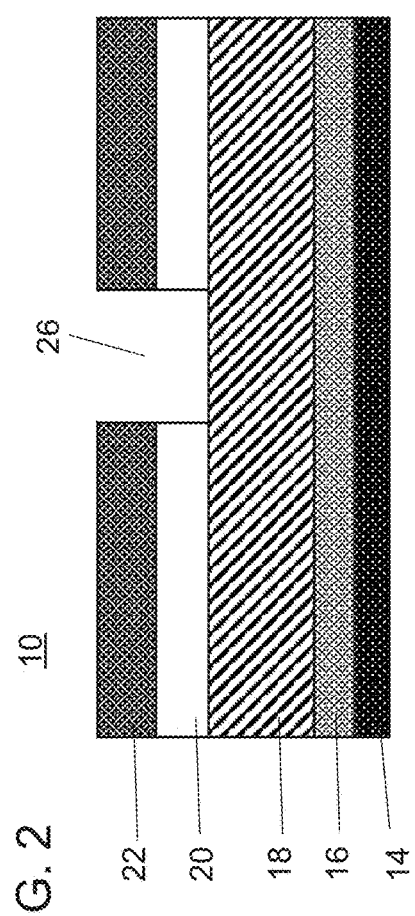

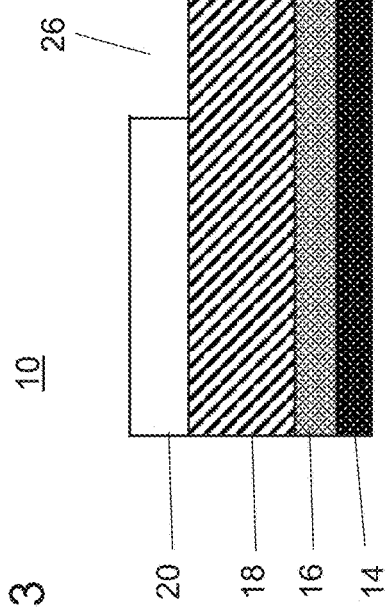
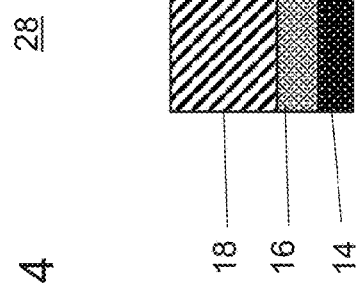

REWORK OF PATTERNED DIELECTRIC AND METAL HARDMASK FILMS

BACKGROUND

Technical Field

The present invention generally relates to semiconductor fabrication, and more particularly to systems and methods for reworking patterned stacks that are dimensionally out of specification.

Description of the Related Art

In many semiconductor processes, complicated patterning techniques are employed. In one example, complicated self-aligned double patterning (SADP) stacks or self-aligned quadruple patterning (SAQP) stacks can be employed in patterning processes with high tolerances. In such processes, failure to meet a target critical dimension (CD) specification or defectivity specification requires rework of a device being processed.

For SAQP, a stack of layers can include similar dielectric materials. A pattern running through similar dielectric materials exposes an underlying interlevel dielectric (ILD) layer through an opening(s) in the pattern. If one or more patterning processes are dimensionally off, the opening formed through the layers is misprocessed and requires rework. Reworking can include removing one or more of the layers in the stack of layers. The rework process needs to selectively remove one or more patterned films selective to the underlying dielectric layer (ILD). However, reworking in this case is difficult since the similar dielectric materials are exposed and can be damaged by layer removal processing.

In a case where dielectric hardmasks and the ILD layer are similar in chemical composition (e.g., containing Si, O, etc.), conventional rework processes like plasma etching and chemical mechanical polishing (CMP) fail to selectively remove patterned layers.

SUMMARY

In accordance with an embodiment of the present invention, a method for reworking a semiconductor device includes, in a pattern stack formed on an interlevel dielectric (ILD) layer, polishing the pattern stack to remove a top hardmask layer of the pattern stack. Each hardmask layer of the pattern stack is selectively wet etched to remaining layers of the pattern stack and the ILD layer. A reworked pattern stack is reformed on the ILD layer.

Another method for reworking a semiconductor device includes evaluating a pattern failure in a pattern stack formed on an interlevel dielectric (ILD) layer; polishing the pattern stack to remove a top hardmask layer of the pattern stack; wet etching a next hardmask layer of the pattern stack selectively to remaining layers of the pattern stack and the ILD layer; wet etching the pattern stack selectively to the ILD layer to expose the ILD layer; and reforming a reworked pattern stack on the ILD layer.

Yet another method for reworking a semiconductor device includes, in accordance with a pattern failure in a pattern stack formed on an interlevel dielectric (ILD) layer and having three or more layers, chemical mechanical polishing the top hardmask layer selectively to an underlying layer in the pattern stack to remove a top hardmask layer of the pattern stack; wet etching a metal hardmask layer of the pattern stack selectively to remaining layers of the pattern stack and the ILD layer; wet etching the pattern stack selectively to the ILD layer to expose the ILD layer by removing a bottom hardmask layer, wherein at least two of the three or more layers and the ILD layer include a similar etch behavior; and reforming a reworked pattern stack on the ILD layer.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 1 is a cross-sectional view showing a pattern stack of a semiconductor device formed on an interlevel dielectric (ILD) layer, the pattern stack including a defective property to trigger a rework scenario in accordance with embodiments of the present invention;

FIG. 2 is a cross-sectional view of the device depicted in FIG. 1 showing a top hardmask layer removed from the pattern stack by a selective polishing process, such as chemical mechanical polishing (CMP) in accordance with embodiments of the present invention;

FIG. 3 is a cross-sectional view of the device depicted in FIG. 2 showing another hardmask layer (e.g., a metal hardmask) removed from the pattern stack by a selective wet etch process that preserves underlying layers or structures in accordance with embodiments of the present invention;

FIG. 4 is a cross-sectional view of the device depicted in FIG. 3 showing a bottom hardmask layer removed from the pattern stack by a selective wet etch process that preserves underlying layers or structures (e.g., an interlevel dielectric layer) in accordance with embodiments of the present invention;

DETAILED DESCRIPTION

Figure 5:
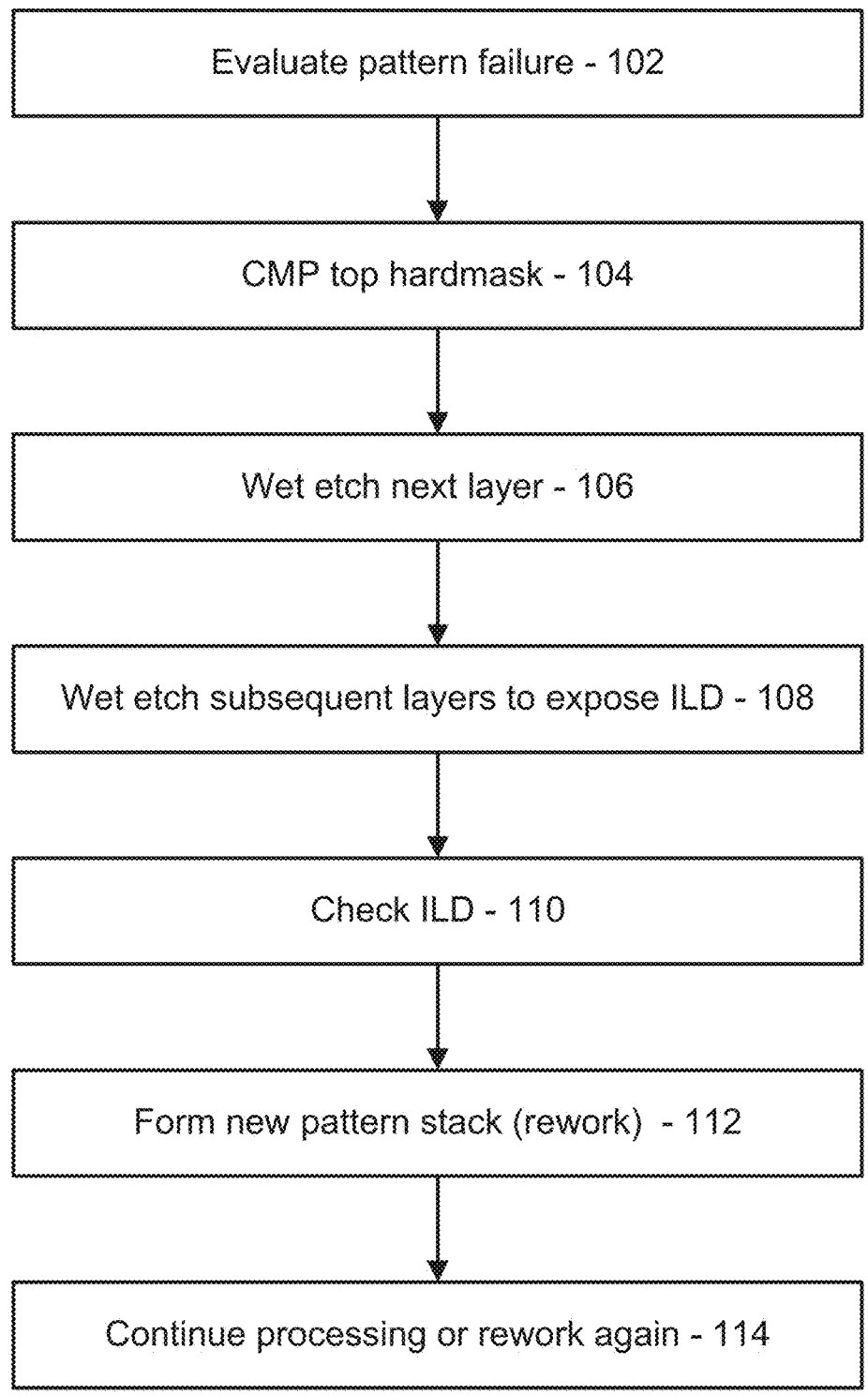
FIG. 5 is a block/flow diagram showing methods for reworking a semiconductor device by removing a pattern stack or stacks in accordance with embodiments of the present invention.

Embodiments of the present invention include rework processing to selectively remove multiple patterned films selective to underlying dielectric materials, e.g., interlevel dielectric layers (ILDs). In one particularly useful embodiment, a stack of patterned films or pattern stack is formed over an underlying dielectric layer. The stack can include a bottom dielectric hard mask, a metal hardmask and a top dielectric hardmask. The top, metal and bottom hardmasks are patterned to be employed in a self-aligned double patterning (SADP) or self-aligned quadruple patterning (SAQP) patterning process, although other patterning processes are contemplated.

In one scenario, a patterning failure occurs where rework is needed. The patterning failure can include a critical dimension being off, defectivity outside of a specified amount, etc. In such an instance, the pattern stack needs to be removed in its entirety so that a new stack can be formed. The remaining portions of the semiconductor device can be reemployed to deposit the new pattern stack. The removal of the defective pattern stack needs to be performed without or with minimal damage to the underlying layers of the semiconductor device. The underlying layers can include an interlevel dielectric layer (ILD) or other materials including but not limited to metallization or other materials.

The present embodiments provide a sequence of actions to remove layers of the patterning stack sequentially without damaging the underlying dielectric layer (e.g., ILD). In this way, the device can be employed from a point where the dielectric layer is exposed and rework can begin without recourse after the removal of the stack.

In accordance with embodiments of the present invention, rework methods are provided, which can reverse the prior work of forming a pattern stack. The sequential and planned removal of each layer of the pattern stack can be achieved using different removal processes provided to reduce damage to the underlying structures and to similar layers in the pattern stack itself to provide uniform removal and increase the likelihood that the rework will be successful.

In one example, the top hardmask layer is removed by a chemical mechanical polish (CMP) process. The CMP stops on the metal hardmask and can remove a portion of the metal hardmask as well. Next, a wet etch is employed to remove the metal hardmask (or remainder thereof) selective to dielectric material remaining on the device (e.g., bottom dielectric hardmask and the dielectric layer (ILD)). Then, another wet etch is performed to remove the bottom dielectric hardmask selective to the dielectric layer (ILD). Other examples are also contemplated with a different number and type of layers.

Since process control remains challenging for SADP and SAQP and other highly complicated patterning techniques, rework processing in accordance with the present embodiments permits reuse of the reworked device, saves resources and reduces costs. For example, the ILD or other layers need not be removed due to damage, or in the worst cases scenario the entire semiconductor device needing to be scrapped. Instead, the defective pattern stack can be removed leaving the underlying layers in a pristine condition to permit further processing and completion of the semiconductor device.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a semiconductor device 10 is illustratively shown. It should be understood that the semiconductor device 10 can include any suitable device and is not limited to the materials and layers illustratively described.

The semiconductor device 10 can include a partially fabricated integrated circuit chip or wafer. The semiconductor device 10 can include a processor chip, a memory chip, an application specific chip, combinations of these and any other chips.

The semiconductor device 10 includes a substrate 12 having multiple layers formed thereon. The substrate 12 can include any suitable substrate structure, e.g., a bulk semiconductor, a semiconductor-on-insulator (SOI) substrate, etc.

In one example, the substrate 12 can include a silicon-containing material. Illustrative examples of Si-containing materials suitable for the substrate 12 can include, but are not limited to, Si, SiGe, SiGeC, SiC and multi-layers thereof. Although silicon is the predominantly used semiconductor material in wafer fabrication, alternative semiconductor materials can be employed instead of or as additional layers, such as, but not limited to, germanium, gallium arsenide, gallium nitride, silicon germanium, cadmium telluride, zinc selenide, etc.

In the embodiments shown, the substrate 12 includes one or more dielectric layers formed thereon, although other layers including semiconductor materials, conductive materials or combinations of any of these materials may be included. In one example, for a SAQP and/or SADP processing, a thin layer 14 is formed on the substrate 12. The thin layer 14 can include a thickness of between about 40 to 80 Angstroms and can include antireflection properties (e.g., for ultraviolet ranges of wavelengths). In one embodiment, the thin layer 14 includes SiN, SiCN, although other dielectric materials can be employed. A transition layer 16 can be formed on the thin layer 14. The transition layer 16 can be employed to provide improved surface properties for forming an interlevel dielectric (ILD) layer 18. In one embodiment, layer 16 can include SiON and/or SiOC with a thickness range between about 50 to about 150 Angstroms.

The ILD layer 18 is formed on the transition layer 16 by any suitable process, e.g., chemical vapor deposition (CVD), etc. The ILD layer 18 can be formed from an oxide a carbon doped oxide, a SiCOH material, a porous material or other dielectric or low-k dielectric or ultralow-k dielectric materials. The materials described are for illustrative purposes as the present embodiments can be employed with any underlying materials, structures or layers. The underlying structure can include ILD layer 18 or other layers or structure that is sensitive to the removal of a pattern stack as well be described.

The ILD layer 18 needs to be protected during patterning of a stack of layers formed thereon. In addition, during any rework process the ILD layer 18 needs to be protected during rework processing. By making the ILD layer 18 protectable during rework processing, time, costs and materials can be preserved. This is particularly useful in highly complicated patterning processes where dimensional and defect specifications are more challenging to meet. By preserving the ILD layer 18 or other sensitive layers, rework can be limited to the removal and reestablishment of the pattern stack and not the removal of the underlying materials or layers, such as the ILD layer 18 or other underlying structures.

A pattern or patterning stack 25 can include two or more layers. In particularly useful embodiments, one or more of the layers can include similar materials as the ILD layer 18. Similar materials for purposes of this disclosure can include materials that are susceptible to etching damage during an etching process. In accordance with one embodiment, the stack of layers includes a bottom dielectric hardmask 20, a metal hardmask 22 and a top dielectric hardmask 24. One or more of these layers 20, 22, 24 can include similar materials to each other, and one or more of these layers 20, 22, 24 can include similar materials to the ILD layer 18 or other underlying structure or layer.

In a useful embodiment, the bottom dielectric hardmask 20 can include a silicon oxide (e.g., TEOS), a low temperature (200 degrees C.) silicon oxide, a silicon nitride or other dielectric materials. The metal hardmask 22 can include TaN, TiN or similar material. The metal hardmask 22 preferably includes a metal-containing compound that can be dielectric or conductive depending on the application.

The top dielectric hardmask 24 can include a silicon oxide, a silicon nitride or other dielectric materials. The ILD layer 18 can include ultra-low-k dielectric materials, such as e.g., porous SiCOH, although other materials can be employed, such as e.g., $SiO_2$.

A patterning process can include SADP, SAQP or other lithographic patterning process. Features, such as, e.g., trenches 26, are etched for conductive structures. The etching process can include a reactive ion etch (RIE) process. While a trench 26 is depicted as a pattern feature, other features or structures are also contemplated, such as mesas, lines, blocks, etc.

In one example using the materials described in the useful embodiment, a pattern failure can occur in one or more areas of the structure of device 10, e.g., layers of the stack 25 can be misaligned, critical dimensions (CD) may not have been maintained, defects may exceed specifications, etc. In accordance with embodiments of the present invention, the stack 25 of layers can be removed to rework the device 10 with minimal damage to underlying structures and can be done despite the presence of similar materials in the stack 25 of layers and the ILD layer 18. The rework process can include different chemistries and processing orders depending on the materials and the number of stack layers.

Rework refers to the ability to remove pattern stacks and reapply a new pattern stack on a semiconductor device. The removal and reapplication of the pattern stack is completed in accordance with the present embodiments without significant damage to the underlying structures, e.g., ILD layer 18.

Referring to FIG. 2, a chemical mechanical polish (CMP) can be employed to remove the top dielectric hardmask 24. The CMP can rely more on abrasive removal than chemical etching to preserve the underlying layers from damage. The CMP stops on the metal hardmask 22 to ensure a complete removal of the top dielectric hardmask 24. The CMP can be selective to the top dielectric hardmask 24. In one embodiment, the metal hardmask 22 can be partially removed by the CMP process as well to reduce the amount of etching needed to remove the metal hardmask 22.

Referring to FIG. 3, a selective wet etch is employed to remove the metal hardmask 22 or the remainder of the metal hardmask 22. The wet etch includes a chemistry that selectively removes the metal hardmask 22 relative to the dielectric material of the bottom hardmask 20 and the ILD layer 18 (or other underlying structure).

In one embodiment, the wet etch chemistry can include a solution mixture of hydrogen peroxide, ammonium hydroxide and deionized water (DIW). The solution can include a mixture, such as, e.g., $H_2O_2:NH_4OH:DIW$ in a ratio of about 3:2:100 at a temperature of between about greater than 25 degrees C. to about 65 degrees C. This mixture can include a Standard Clean 1 (SC1) clean employed for removing residue or to clean new wafers before processing. While the SC-1 solution is designed to remove organic contaminants from Si, oxide and quartz surfaces, SC-1 can be employed to remove the metal hardmask 22 without damage to the underlying layers including the bottom hardmask 20.

In the above mixture (SC1), alternative oxidizers to hydrogen peroxide can include potassium persulfate, potassium periodate and/or potassium permanganate. In the above mixture, alternative bases to ammonium hydroxide can include quaternary ammonium hydroxides. Other mixture components and ratios can also be employed to preserve the underlying layers from damage.

The wet etch can stop on the bottom dielectric hardmask 20 and avoid etching or damage to the ILD layer 18. The wet etch is particularly useful in removing metal-containing layers selectively to dielectric materials. The selectivity preserves the uniformity of the layers below. In this way, a cleaner removal can be achieved.

Referring to FIG. 4, another wet etch can be employed to remove the bottom dielectric hardmask 20. The wet etch can include a chemistry that selectively removes the bottom dielectric hardmask 20 relative to the dielectric material of the ILD layer 18. In one embodiment, the etch chemistry includes a diluted HF etch in the ratio of about 100:1 to about 5000:1 for deionzied water:HF (e.g., 49 wt %) or a buffered HF (e.g., a mixture of $NH_4F+HF$) to preserve the ILD layer 18 from damage. The wet etch can stop on the ILD layer 18. The ILD layer 18 remains virtually undamaged and can be employed for rework by rebuilding the stack 25 of layers for reprocessing the device 10 as a reworked device 28.

In some embodiments, the ILD layer 18 of the rework device 28 is analyzed for surface damage using, e.g., optical reflection techniques for thickness measurement, X-ray photoelectron spectroscopy for surface elemental/bonding, top down scanning electron microscopy, atomic force microscopy for roughness, etc. The ILD layer 18 can be measured to confirm that adequate thickness remains for reworking or other suitable conditions have been maintained. In the event that adequate thickness and surface properties are present, the rework device 28 can again be employed for depositing a stack layer (25) for patterning the ILD layer 18.

While the CMP processing can be performed to remove all of the stack 25 of layers, testing data performed for the rework processing in accordance with the present embodiments shows that all CMP reworks (e.g., CMP to remove all three layers) to remove the layers in the stack results in incomplete pattern removal, non-uniformities and non-selective damage to the ILD layer 18. In addition, all wet etching (e.g., wet etch to remove all three layers) to remove the stack 25 of layers resulted in pattern lift-off and defectivity increases. Lift-off can occur when wet etching a higher layer where a lower layer include similar materials.

The combination of CMP and wet etching in accordance with the present embodiments provided a residue free pattern removal with high selectivity and high quality surfaces (high goodness of fitness (GOF) for rework) for the ILD layer 18. In addition, the high selectivity maintained sufficient thickness for rework to occur.

In useful embodiments, rework of a patterned structure can be achieved where the patterned structure or stack includes two (preferably three) or more films stacked on top of interlayer dielectric (ILD) or other sensitive structure. The present embodiments are particularly useful when at least two films are similar in chemical composition, have similar plasma etch behavior or similar wet etch behavior. The at least two films with similar etch behavior are usually not adjacent in the stack. CMP is applied to remove a top film, wet etching (with different chemistries for different layers) can be used to remove the remaining stack including the other similar film and stop on the ILD.

Examples of similar composition films can include one film having $SiO_2$ and a second film having $SiO_2$ (e.g., same material); one film having $TEOS-SiO_2$ deposited at about 400 degrees C. and a second film having a low temperature (e.g., 200 degrees C.) $SiO_2$; one film having chemical vapor deposited (CVD) SiN deposited at 400 degrees C. or higher and a second film having SiN deposited at a temperature lower than 400 degrees C., etc. In one example, the remaining films can be wet etched in single wet step where one film includes $SiO_2$ and another includes SiN. The single wet etch can include a HF solution.

The list of similar composition films is not exhaustive. Materials with some similarities are also contemplated as certain etch processes can damage underlying layers though to a lesser extent.

Referring to FIG. 5, methods for reworking a semiconductor device are described and shown in accordance with illustrative embodiments. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, a pattern failure in a pattern stack can be evaluated in accordance with specifications to determine whether rework is needed and possible. The pattern stack can include self-aligned double patterning (SADP) stacks, self-aligned quadruple patterning (SAQP) stacks or other pattern stacks employed for other patterning processes. The pattern stack is formed on an ILD layer and can include a plurality of layers including hardmask layers of different types and materials.

In one embodiment, the pattern stack includes a dielectric bottom hardmask layer, a metal hardmask layer formed on the bottom dielectric hardmask layer and the top hardmask layer formed on the metal hardmask layer. The pattern stack can have, e.g., three or more layers (even as few as two). The pattern failure can include any number of issues. Most common issues can include at least one of increased defectivity, an out of specification critical dimension, and layer misalignment, among others.

In block 104, in accordance with the pattern failure, CMP of the top hardmask layer can be performed selectively to an underlying layer in the pattern stack to remove the top hardmask layer. The CMP can further remove a portion of the underlying layer as well (e.g., the metal hardmask).

In block 106, a wet etching process is performed to remove a next hardmask layer (e.g., a metal hardmask layer) of the pattern stack. The wet etch is selective to remaining layers of the pattern stack and the ILD layer.

In block 108, another wet etching process is selectively performed on the pattern stack to remove a next layer and/or to expose the ILD layer to expose the ILD layer by removing a bottom hardmask layer. In particularly useful embodiments, at least two of the three or more layers and the ILD layer include a similar etch behavior. Many materials employed in semiconductor processing have similar etch behavior. Since the materials of the stack of layers having similar etch behavior could be damaged by the etching of other layers with similar etch behavior, selectivity and process sequences are employed to minimize damage to other layers. The wet etching steps can include a different wet etch chemistry for each step or a same wet etch chemistry for all or a portion of the steps.

In block 110, once the ILD layer is exposed, a thickness of the ILD layer can be checked to determine suitability for rework processing. In addition, the surface quality or the GOF can also be measured to determine the suitability for rework.

In block 112, a new pattern stack (rework) is formed on the ILD layer. The new pattern stack on the ILD layer can include a bottom hardmask layer and at least one other hardmask layer over the ILD layer. These layers can be deposited sequentially. In one embodiment, the pattern stack includes a dielectric bottom hardmask layer, a metal hardmask layer formed on the bottom dielectric hardmask layer and the top hardmask layer formed on the metal hardmask layer. The rework can include a set of stack layers that are different from the original set of stack layers. In this way, the rework can proceed differently from the originally planned patterning process.

In block 114, the processing of the semiconductor device can proceed with the etching of the ILD in accordance with the reworked device. Alternately, the processing can continue with another rework process if the rework pattern stack includes a pattern failure. Testing of the stack can be performed to ensure that the exposed ILD layer (or other layer) has sufficient integrity or possesses the needed properties to perform the rework process. The reworked pattern stack can be reworked two or more times if the appropriate criteria is met. Testing can include surface properties, thickness, material composition or integrity, etc.

Figure 6:
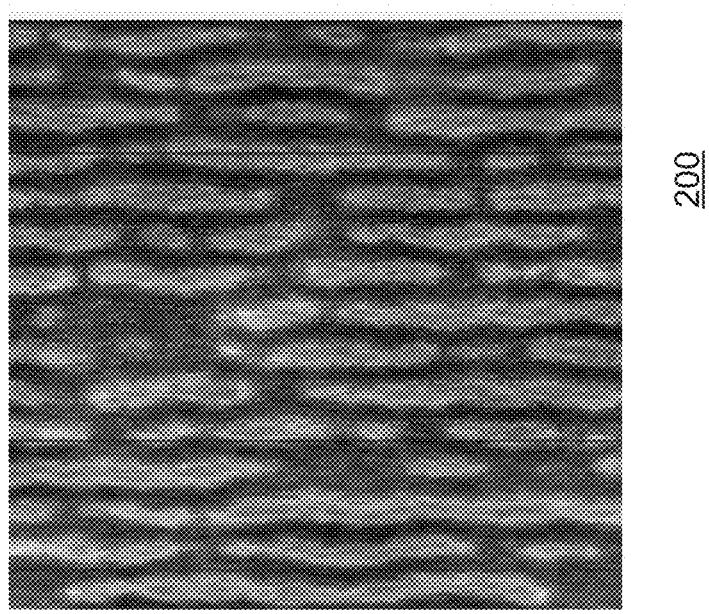
FIG. 6 is an image of a top down view of a semiconductor device showing a misprocessed three layer reactive ion etch (RIE) hard mask needing rework in accordance with embodiments of the present invention.

Referring to FIG. 6, a semiconductor device 200 is shown in a top down view after a misprocessed three layer reactive ion etch (RIE) hard mask is formed. The misprocessed RIE hardmask stack shows non-uniformities and uneven lines. The three layer hard mask included a TEOS top hardmask, a TiN metal hardmask and a SiN hardmask over a ultra-low dielectric constant (ULK) ILD layer. The misprocessed RIE hardmask stack had to be reworked by removing and reprocessing the hardmask in accordance with embodiments of the present invention.

Figure 7:
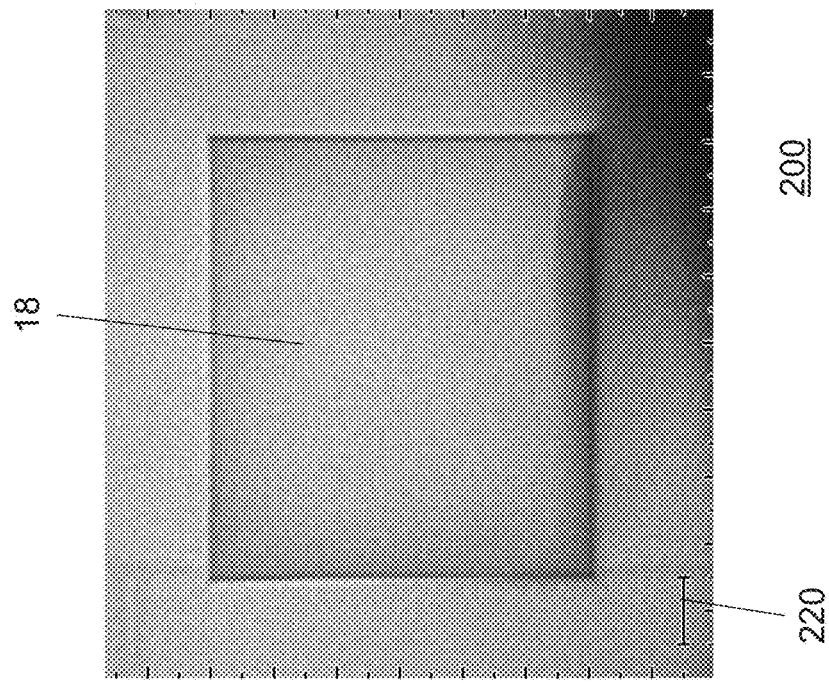
FIG. 7 is an image of the semiconductor device of FIG. 6 showing an interlevel dielectric layer after rework processing in accordance with embodiments of the present invention.

Referring to FIG. 7, the semiconductor device 200 is depicted after rework processing in accordance with embodiments of the present invention. The TEOS top hardmask was removed by CMP. The TiN metal hardmask was partially removed by the CMP process and the remainder was removed using a wet etch selective to the SiN material of the SiN hardmask and the ILD layer. The SiN hardmask was removed by a wet etch selective to the (ULK) ILD layer. The ILD 18 depicted is residue free and has a low defectively. The combination of CMP and wet etching in accordance with the present embodiments provided residue free pattern removal with high selectivity and high quality surfaces (GOF=0.986) for the ILD layer 18. In addition, the high selectivity maintained sufficient thickness for rework to occur. A measurement bar 220 represents a length of 9.6 microns.

Figure 8:
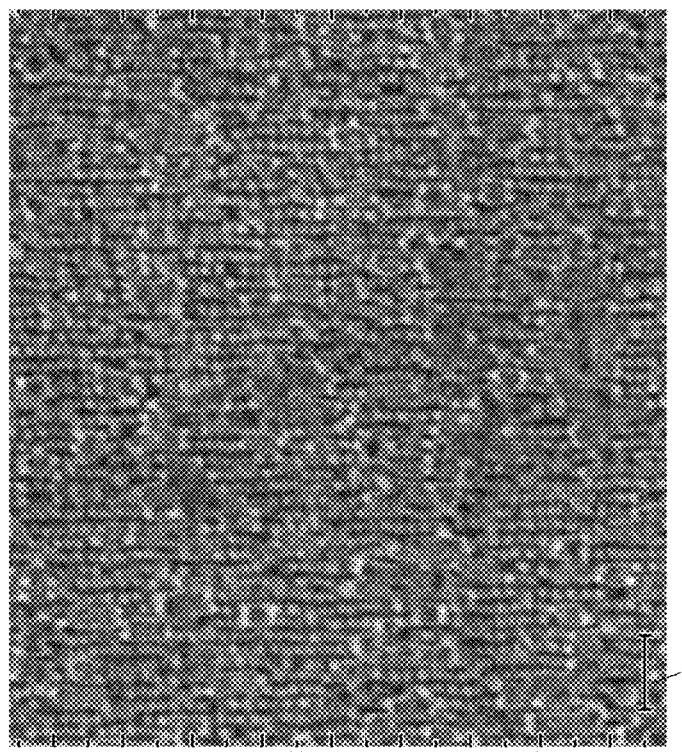
FIG. 8 is a top down view of a device after a misprocessed three layer RIE hard mask is formed and removed by all CMP processing.

Referring to FIG. 8, a top down view of a device 202 is depicted after a misprocessed three layer RIE hard mask is formed and removed by all CMP processing. The CMP processing can be performed to remove all of the three layer hardmask stack of layers; however, all CMP reworks to remove the layers in the stack results in incomplete pattern removal, non-uniformities and non-selective damage to the ILD layer 18 as shown in FIG. 8. A measurement bar 222 represents a length of 0.2 microns.

Figure 9:
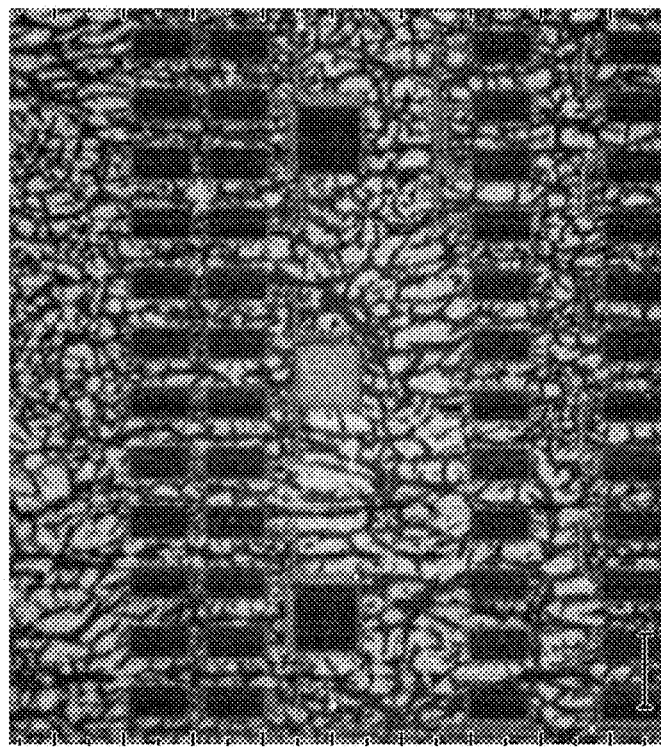
FIG. 9 is a top down view of a device after a misprocessed three layer RIE hard mask is formed and removed by all wet etch processing.

Referring to FIG. 9, a top down view of a device 204 is depicted after a misprocessed three layer RIE hard mask is formed and removed by all wet etch processing. All wet etching to remove the hard mask stack of layers resulted in pattern lift-off and defectivity increases as depicted in FIG. 9. A measurement bar 224 represents a length of 100 microns.

Referring again to FIG. 7, the rework of the device 200 includes a combination of CMP applied to remove the top film and wet etching (with different chemistries for different layers) used to remove the remaining stack. This resulted in the pristine surface with sufficient thickness for rework (e.g., exceeding a target thickness for the ILD) in accordance with the embodiments of the present invention.

Having described preferred embodiments of rework of patterned dielectric and metal hardmask films (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for reworking a semiconductor device, comprising:
   in response to evaluating a pattern failure in a pattern stack formed on an interlevel dielectric (ILD) layer, polishing the pattern stack disposed on an interlevel dielectric (ILD) layer to remove a top hardmask layer of the pattern stack;
   wet etching a next hardmask layer of the pattern stack selectively to one or more remaining layers of the pattern stack and the ILD layer;
   wet etching the one or more remaining layers of the pattern stack selectively to the ILD layer to expose the ILD layer; and
   forming a reworked pattern stack on the ILD layer.

2. The method as recited in claim 1, further comprising evaluating a pattern failure of the pattern stack including at least one of increased defectivity, an out of specification critical dimension or layer misalignment.

3. The method as recited in claim 1, wherein polishing the pattern stack includes chemical mechanical polishing the top hardmask layer selectively to an underlying layer in the pattern stack.

4. The method as recited in claim 1, wherein the wet etching steps include a different wet etch chemistry for each step.

5. The method as recited in claim 1, wherein the wet etching steps include a same wet etch chemistry.

6. The method as recited in claim 1, further comprising checking a thickness of the ILD layer to determine suitability for rework processing.

7. The method as recited in claim 1, wherein forming the reworked pattern stack on the ILD layer includes depositing a bottom hardmask layer and at least one other hardmask layer over the ILD layer.

8. The method as recited in claim 1, wherein the pattern stack includes a dielectric bottom dielectric hardmask layer, a metal hardmask layer formed on the bottom dielectric hardmask layer and the top hardmask layer formed on the metal hardmask layer.

9. The method as recited in claim 1, wherein forming the reworked pattern stack includes reworking the pattern stack two or more times.

10. A method for reworking a semiconductor device, comprising:
    evaluating a pattern failure in a pattern stack formed on an interlevel dielectric (ILD) layer;
    polishing the pattern stack to remove a top hardmask layer of the pattern stack;
    wet etching a next hardmask layer of the pattern stack selectively to remaining layers of the pattern stack and the ILD layer;
    wet etching the pattern stack selectively to the ILD layer to expose the ILD layer; and
    forming a reworked pattern stack on the ILD layer.

11. The method as recited in claim 10, wherein evaluating the pattern failure includes at least one of increased defectivity, an out of specification critical dimension, and layer misalignment.

12. The method as recited in claim 10, wherein polishing the pattern stack includes chemical mechanical polishing the top hardmask layer selectively to an underlying layer in the pattern stack.

13. The method as recited in claim 10, wherein the wet etching steps include a different wet etch chemistry for each step.

14. The method as recited in claim 10, wherein the wet etching steps include a same wet etch chemistry.

15. The method as recited in claim 10, further comprising checking a thickness of the ILD layer to determine suitability for rework processing.

16. The method as recited in claim 10, wherein forming the reworked pattern stack on the ILD layer includes depositing a bottom hardmask layer and at least one other hardmask layer over the ILD layer.

17. The method as recited in claim 10, wherein the pattern stack includes a dielectric bottom dielectric hardmask layer, a metal hardmask layer formed on the bottom dielectric hardmask layer and the top hardmask layer formed on the metal hardmask layer.

18. The method as recited in claim 10, wherein forming the reworked pattern stack includes reworking the pattern stack two or more times.

19. A method for reworking a semiconductor device, comprising:
    chemical mechanical polishing the top hardmask layer selectively to an underlying layer in a misprocessed pattern stack having three or more layers formed on an interlevel dielectric (ILD) layer to remove a top hardmask layer of the pattern stack;
    wet etching a metal hardmask layer of the pattern stack selectively to a bottom hardmask layer of the pattern stack and the ILD layer;
    wet etching the pattern stack selectively to the ILD layer to expose the ILD layer by removing the bottom hardmask layer, wherein at least two of the three or more layers and the ILD layer include a similar etch behavior; and
    forming a reworked pattern stack on the ILD layer.

20. The method as recited in claim 19, wherein the pattern failure includes at least one of increased defectivity, an out of specification critical dimension, and layer misalignment.

21. The method as recited in claim 19, wherein the wet etching steps include a different wet etch chemistry for each step.

22. The method as recited in claim 19, wherein the wet etching steps include a same wet etch chemistry.

23. The method as recited in claim 19, further comprising checking a thickness of the ILD layer to determine suitability for rework processing.

24. The method as recited in claim 19, wherein forming the reworked pattern stack on the ILD layer includes depositing a bottom hardmask layer and at least one other hardmask layer over the ILD layer.

25. The method as recited in claim 19, wherein forming the reworked pattern stack includes reworking the pattern stack two or more times.

* * * * *